United States Patent [19]
Yoshida

[11] Patent Number: 5,278,090
[45] Date of Patent: Jan. 11, 1994

[54] METHOD FOR MANUFACTURING A DYNAMIC RAM HAVING 3-DIMENSIONAL MEMORY CELL STRUCTURE

[75] Inventor: Tohru Yoshida, Warabi, Japan

[73] Assignee: Kabushiki Kaisha Toshiba, Kawasaki, Japan

[21] Appl. No.: 942,393

[22] Filed: Sep. 9, 1992

Related U.S. Application Data

[62] Division of Ser. No. 639,342, Jan. 10, 1991, Pat. No. 5,166,762.

[30] Foreign Application Priority Data

Jan. 20, 1990 [JP] Japan .................. 2-11232

[51] Int. Cl.$^5$ ............... H01L 21/70; H01L 27/00
[52] U.S. Cl. .................. 437/52; 437/60; 437/919
[58] Field of Search ............ 437/43, 48, 52, 60, 437/919, 228; 156/643; 257/301–309; 287/401

[56] References Cited

U.S. PATENT DOCUMENTS

| | | | |
|---|---|---|---|
| 4,920,389 | 4/1990 | Itoh | 257/302 |
| 5,001,526 | 3/1991 | Gotou | 257/302 |
| 5,135,879 | 8/1992 | Richardson | 437/43 |
| 5,155,059 | 10/1992 | Hieda | 437/52 |

FOREIGN PATENT DOCUMENTS

62-268156 11/1987 Japan.

*Primary Examiner*—Olik Chaudhuri
*Assistant Examiner*—H. Jey Tsai
*Attorney, Agent, or Firm*—Finnegan, Henderson, Farabow, Garrett & Dunner

[57] ABSTRACT

A semiconductor region of a first conductivity type is formed in a column configuration on a semiconductor substrate, and acts as a source region (or a drain region) and a storage node electrode. A second semiconductor region of the first conductivity type is formed with a capacitor insulation film disposed between it and the side wall of the first semiconductor region and acts as a cell plate electrode. A third semiconductor region of a second conductivity type which is formed in an annular configuration is formed on the upper portion of the first semiconductor region and acts as a channel region. A first conductive layer is formed with a gate insulation film disposed between the first conductive layer and each of the inner and outer side walls of the third semiconductor region and acts as a transfer gate electrode. A fourth semiconductor region of the first conductivity type is formed in an area near the end portion of the opening of the third semiconductor region which is formed in the annular configuration and acts as a drain region (or a source region). A second conductive layer is formed in contact with the fourth semiconductor region and acts as a bit line.

9 Claims, 5 Drawing Sheets

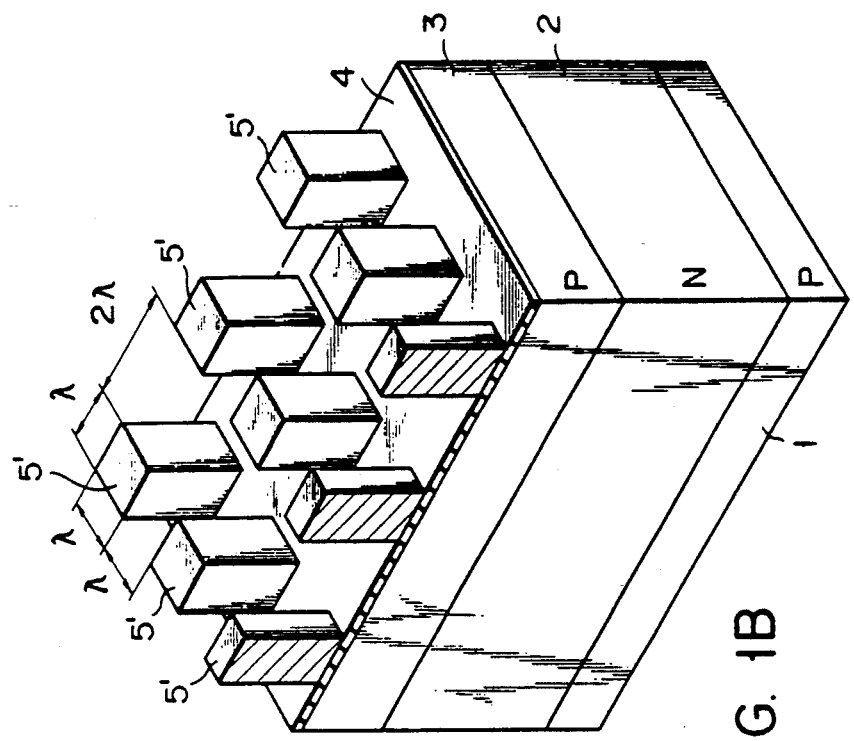
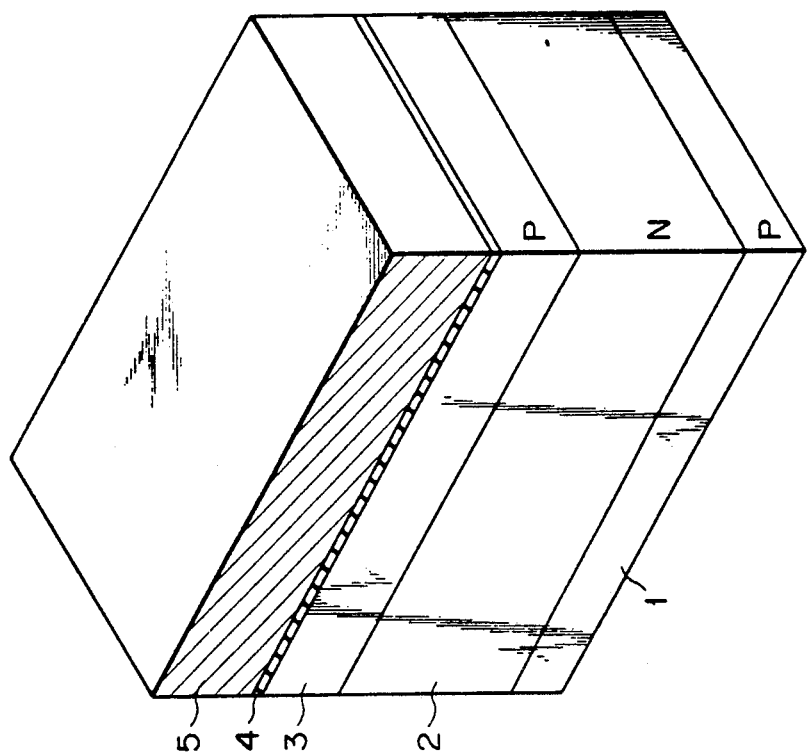
FIG. 1A
FIG. 1B

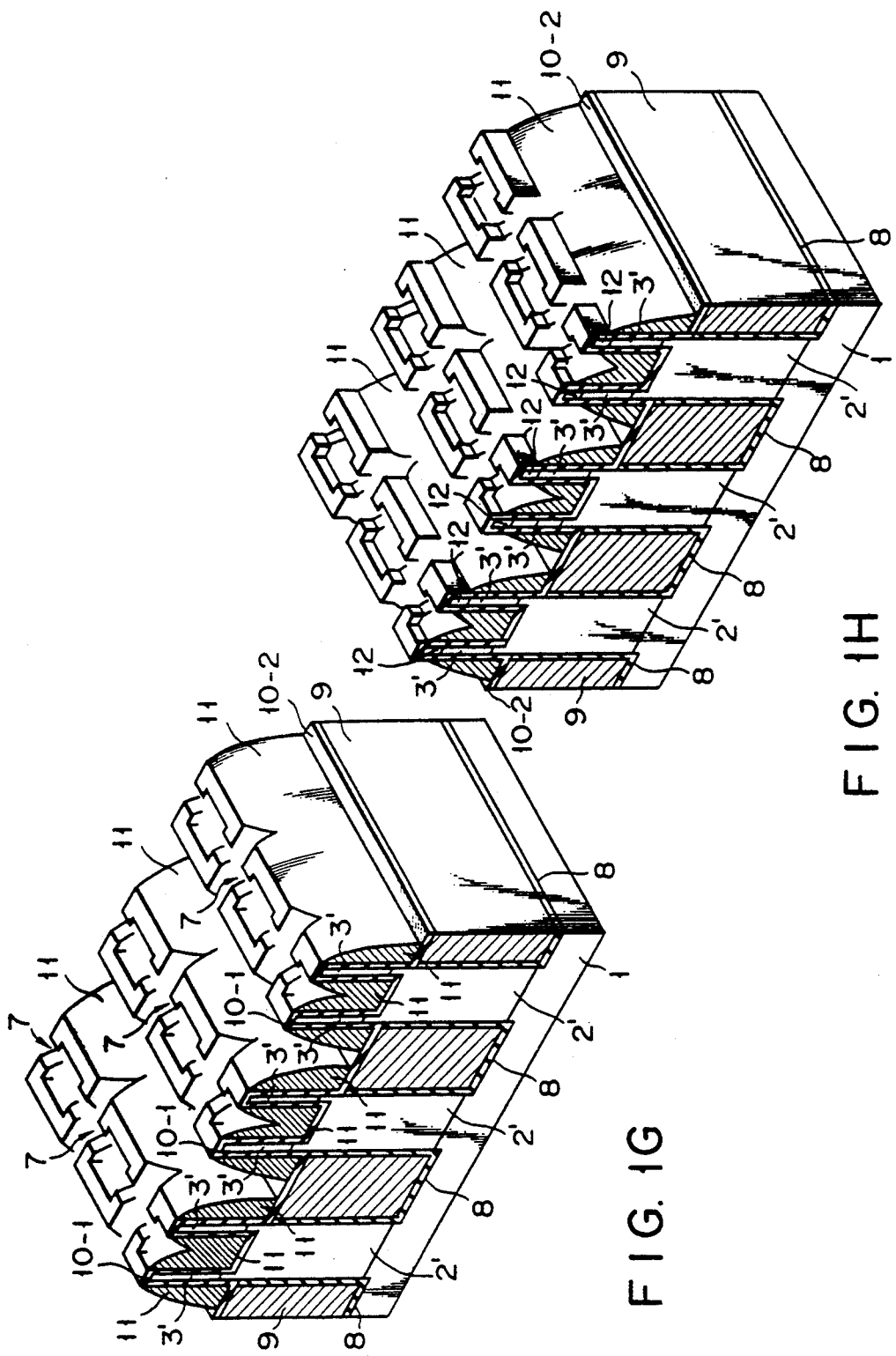

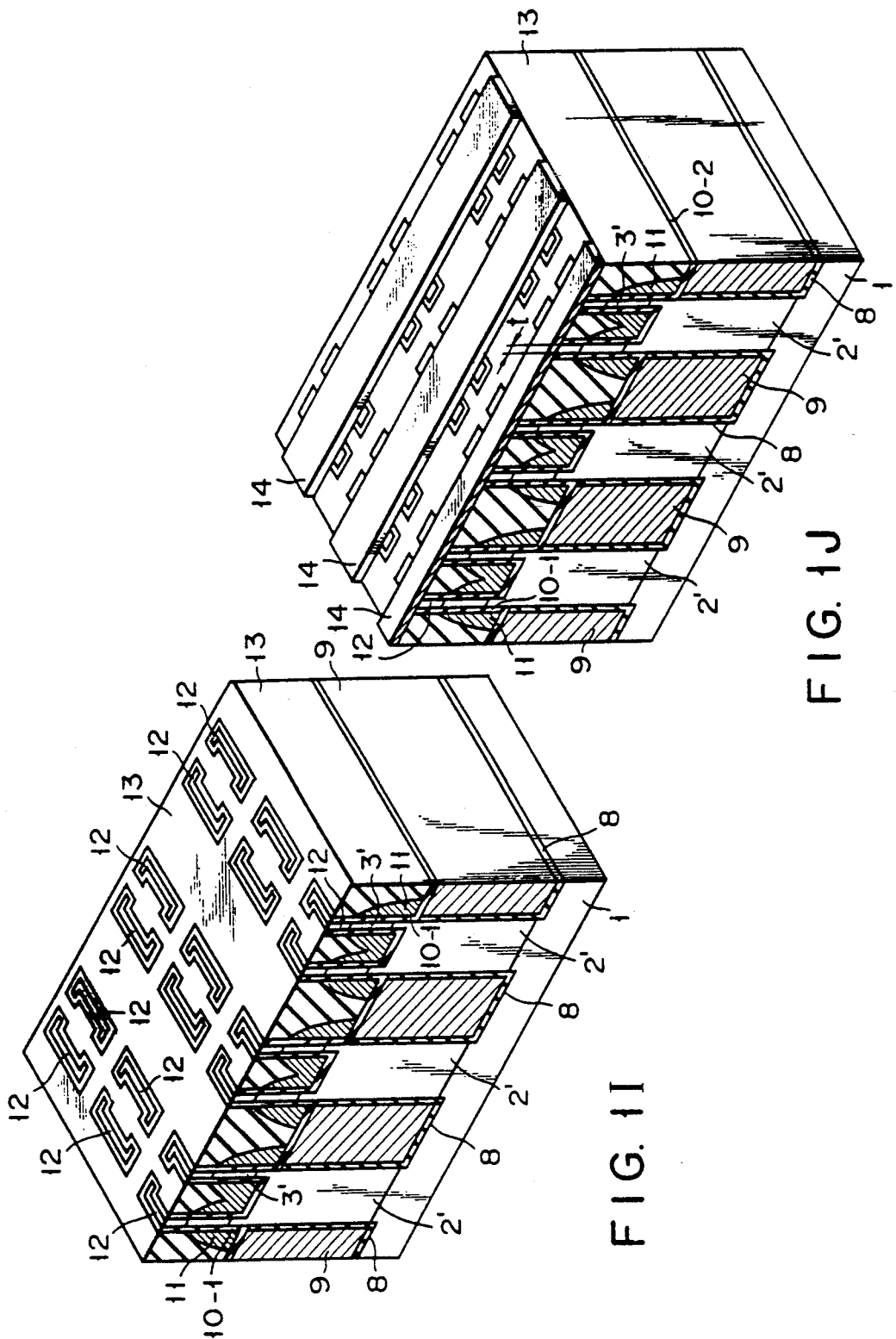

METHOD FOR MANUFACTURING A DYNAMIC RAM HAVING 3-DIMENSIONAL MEMORY CELL STRUCTURE

This is a division of application Ser. No. 07/639,342, filed Jan. 10, 1991 now U.S. Pat. No. 5,166,762.

BACKGROUND OF THE INVENTION

1. Field of the Invention

This invention relates to a semiconductor memory device and a method for manufacturing the same, and more particularly to a dynamic RAM having a 3-dimensional memory cell structure and a method for manufacturing the same.

2. Description of the Related Art

A dynamic RAM is one of the semiconductor memory devices in which the most advanced fine patterning process is applied. Various types of new memory cell structures have been proposed to develop dynamic RAMs with higher integration density. A trench transistor cross-point type memory cell (which is hereinafter referred to as a TTC type memory cell) is known as a memory cell structure of the dynamic RAM having the highest integration density at present. For example, the TTC type memory cell is disclosed in Technical Digest International Electron Devices Meeting 1985, pp. 714 to 717, "A TRENCH TRANSISTOR CROSS-POINT DRAM CELL" W. F. Richardson et al.

The equivalent circuit of the TTC type memory cell is the same as the equivalent circuit of a so-called one-transistor/one-capacitor type memory cell and has a feature that a capacitor is arranged at every intersection between the bit line and word line.

The TTC type memory cell has an advantage that the memory cell can be integrated with a high integration density but at the same time it has the following defects.

First, in the TTC type memory cell, a MOS transistor acting as a transfer gate is formed by use of the side wall of a trench which is formed by etching the semiconductor substrate. For this reason, various interface states occur in the interface between the gate insulation film and the semiconductor substrate, making the characteristic of the MOS transistor unstable and lowering the driving ability thereof.

Secondly, since bit lines formed of n-type impurity diffused layers are arranged in opposition to one another in the main surface area of the semiconductor substrate, it becomes necessary to form an element isolation region for isolation the memory cells from each other between the bit lines.

Thirdly, since the n-type impurity diffused layer acting as the bit line is formed to surround the trench portion, the area thereof becomes large. For this reason, a parasitic capacitance between the bit line and the substrate becomes large, causing the operation speed to be lowered.

SUMMARY OF THE INVENTION

Accordingly, a first object of this invention is to provide a semiconductor memory device in which the driving ability of a transfer gate can be enhanced and the operation speed can be made high.

A second object of this invention is to provide a method for manufacturing a semiconductor memory device in which the driving ability of a transfer gate can be enhanced and the operation speed can be made high.

The first object can be attained by a semiconductor memory device comprising a substrate; first semiconductor regions of a first conductivity type each formed in a column configuration on the substrate and acting as a storage node electrode; capacitor insulation films formed on the side walls of the first semiconductor regions; second semiconductor regions of the first conductivity type acting as a cell plate electrode and formed with the capacitor insulation films respectively disposed between the second semiconductor regions and the side walls of the first semiconductor regions; third semiconductor regions of a second conductivity type acting as a channel region and respectively formed in an annular configuration on the upper portions of the first semiconductor regions; gate insulation films formed on the inner and outer side walls of the third semiconductor regions; first conductive layers acting as a transfer gate electrode and respectively formed with the gate insulation films disposed between the first conductive layers and the inner and outer side walls of the third semiconductor regions; fourth semiconductor regions of the first conductivity type formed in areas near the end portions of openings of the third annular semiconductor regions; and second conductive layers acting as a bit line and formed in contact with the fourth semiconductor regions, respectively.

The second object of this invention is attained by a method for manufacturing semiconductor memory devices comprising the steps of forming a first semiconductor layer of a first conductivity type on a substrate; forming a second semiconductor layer of a second conductivity type on the first semiconductor layer; forming a first insulation film on the second semiconductor layer; forming a third semiconductor layer on the first insulation film; patterning the third semiconductor layer into a column configuration; subjecting the surface of the third semiconductor layer thus patterned to an oxidizing process to form a first oxide film; selectively removing part of the third semiconductor layer, first insulation film, second semiconductor layer, first semiconductor layer and substrate with the first oxide film used as a mask to form the first semiconductor layer into a column configuration and form the second semiconductor layer into an annular configuration; removing the first oxide film; forming cut-away portions in a direction of extension of word lines in part of the second semiconductor layer which is formed in the annular configuration; forming a second insulation film around the first semiconductor layer which is formed in the column configuration; forming a fourth semiconductor layer on the resultant structure; etching back the fourth semiconductor layer until the second semiconductor layer is entirely exposed and leaving the fourth semiconductor layer around the second insulation film; forming a third semiconductor layer around the second semiconductor layer which is exposed and the fourth semiconductor layer which is exposed; forming a first conductive layer acting as a word line on the resultant structure; leaving the first conductive layer on the side wall of the third insulation film; etching back the first conductive layer which is left behind to expose part of the second semiconductor layer; forming an impurity region of the first conductivity type in an area near the exposed portion of the second semiconductor layer; forming a third insulation film on the resultant structure; etching back the third insulation film at least until the impurity region of the first conductivity type is exposed; and forming a second conductive layer acting as a bit line in contact with the impurity region of the first conductivity type.

With the semiconductor memory device of the above construction, since the transfer gate electrode is formed around the side wall surface of the annular region acting as a channel portion, a MOS transistor of a so-called dual gate structure having a large driving ability can be obtained. As a result, reduction in the driving ability due to the presence of an interface state caused between the annular region and the gate insulation film by forming the annular region by use of an etching process can be suppressed. Further, source and drain regions are formed in the annular region, part of the drain region is exposed on the interlaid insulation film and the exposed portion is used as a contact area of the bit line. As a result, the bit line can be formed in position which is apart from the conductive layer such as the substrate, thereby reducing the parasitic capacitance associated with the bit line and enhancing the operation speed of the device.

Further, with the above manufacturing method, there is a step of leaving the transfer gate electrode on the side wall of the annular region in a self-alignment manner. In this step, a conductive layer used as the transfer gate electrode is divided in a direction in which the interval of the arrangement of the annular region is large. An element isolation region can be obtained by an insulation film buried in the divided areas and the trench formed around the annular region, they can be used as an element isolation region and therefore the dimension of the isolation region can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1J are perspective views of memory cell structures shown in the order of the manufacturing steps, for illustrating a semiconductor memory device according to an embodiment of this invention.

DETAILED DESCRIPTION OF THE PREFERRED EMBODIMENTS

Figure 1D:
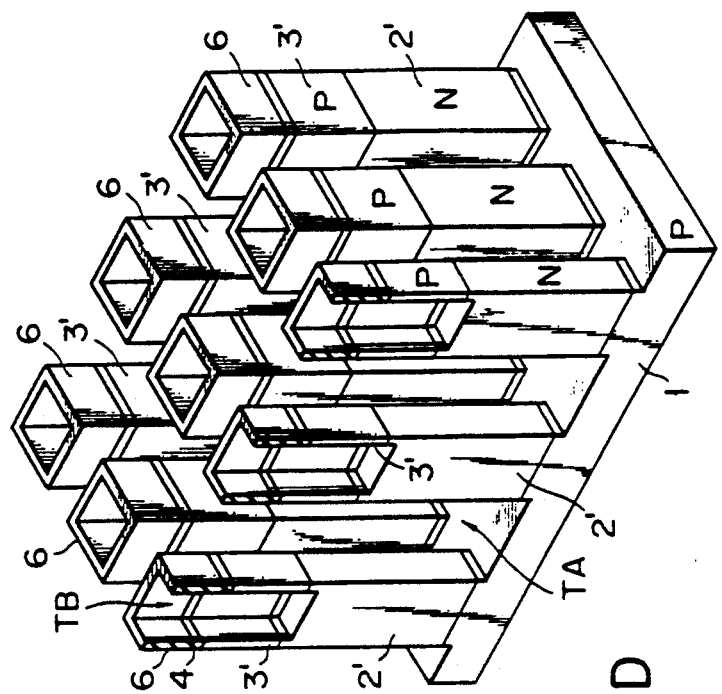

There will now be described a semiconductor memory device according to an embodiment of this invention in accordance with the manufacturing steps with reference to the accompanying drawings.

FIGS. 1A to 1J are perspective views schematically showing memory cell structures in the order of the manufacturing steps of a semiconductor memory device according to an embodiment of this invention and partly cut-away portions are shown in the perspective views for better understanding of the memory cell structure.

As shown in FIG. 1A, an N-type silicon layer 2 having an impurity concentration of approx. $1 \times 10^{19}$ to $1 \times 10^{20}$ cm$^{-1}$, for example, is formed into a thickness of approx. 3 $\mu$m on a P-type silicon substrate 1 having an impurity concentration of approx. $1 \times 10^{17}$ to $1 \times 10^{18}$ cm$^{-3}$, for example, by an epitaxial growth method. A P-type silicon layer 3 having an impurity concentration of approx. $1 \times 10^{16}$ to $1 \times 10^{17}$ cm$^{-3}$ is formed to a thickness of approx. 1.5 $\mu$m on the N-type silicon layer 2 by an epitaxial growth method. For example, a silicon oxide film 4 of a thickness of approx. 1000 Å is formed in the main surface area of the P-type silicon layer 3 by a thermal oxidation method. A polysilicon layer is formed to a thickness of approx. 2 $\mu$m on the silicon oxide film 4 by a CVD method, for example. Phosphorus is diffused into the polysilicon layer by use of phosphoryl chloride (POCl$_3$) or ion-implanted into the polysilicon layer 5 so that the polysilicon layer 5 may have the N-type conductivity type.

Next, as shown in FIG. 1B, the polysilicon layer 5 is patterned by use of the photolithography technology using a photoresist to form a column-shaped region 5'. The column-shaped region 5' is formed in a square form of $\lambda \times \lambda$. The interval between the column-shaped regions 5' is $\lambda$ in a first direction and 2$\lambda$ in a second direction which is perpendicular to the first direction. The value of $\lambda$ may be 1 $\mu$m, for example.

Figure 1C:
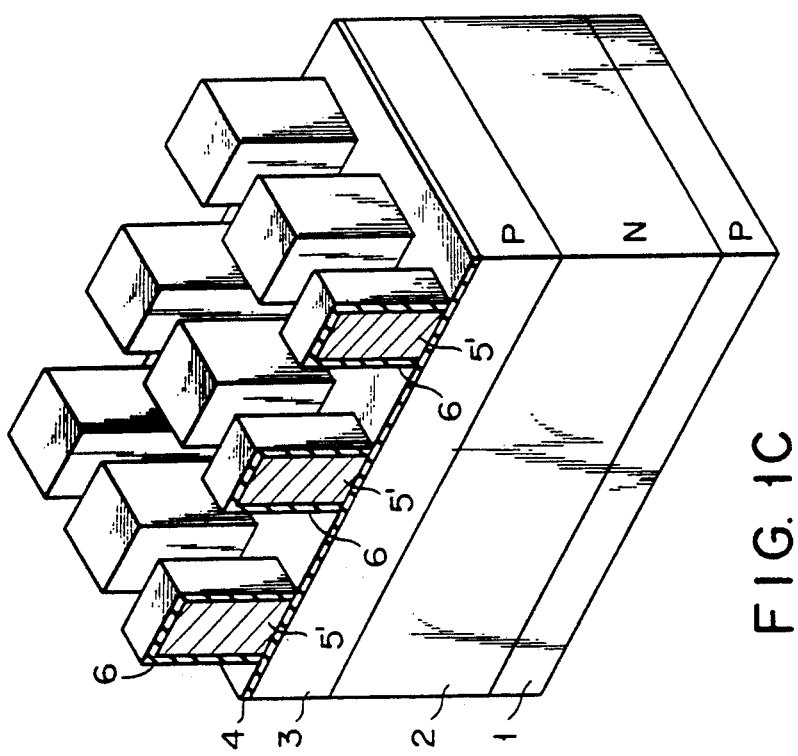

As shown in FIG. 1C, a silicon oxide film 6 is formed to a thickness of approx. 2000 Å on the surface of the column-shaped region 5' of polysilicon by a thermal oxidation process.

Next, as shown in FIG. 1D, the main surface of the resultant semiconductor structure is selectively etched by an RIE method which is an anisotropic etching process. In a case where the etching process by use of the RIE method is effected under a condition that the selective etching ratio between the silicon and silicon oxide films is set at 10, a deep trench portion TA is formed in the N-type silicon layer 2 so as to form column-shaped regions 2' which densely stand on the substrate 1. Annular regions 3' which are formed by patterning the P-type silicon layer 3 and forming a shallow trench portion TB therein are respectively arranged on the column-shaped regions 2'. The column-shaped region 2' is formed as an area which acts as a storage node electrode by a later manufacturing step and the annular region 3' is formed as an area which mainly acts as a channel portion.

Now, the manufacturing process of the column-shaped regions 2' and annular regions 3' is explained. First, the surface of the silicon oxide film 4 on the P-type silicon layer 3 and the surfaces of the silicon oxide films 6 on the column-shaped regions 5' are etched by irradiating ions onto the main surface of the semiconductor structure shown in FIG. 1C by use of the RIE method. As the etching process proceeds, the oxide film 4 of a thickness of 1000 Å is first removed to expose the surface of the silicon layer 3. When the etching process further proceeds, the oxide films 6 of 2000 Å are removed and the surfaces of the column-shaped regions 5' are exposed. At this time, since the selective etching ratio is 10, the silicon layer 3 is etched by 10000 Å or 1 $\mu$m while the oxide film 6 is being etched by 1000 Å.

When the etching process further proceeds and the column-shaped regions (polysilicon) 5' of a thickness of 2 $\mu$m are entirely etched, the surface of the oxide film 4 is exposed. In this case, the oxide film 6 formed around the column-shaped region 5' is etched only by 2000 Å and the oxide film 6 is left behind in an annular form around the exposed oxide film 4. The silicon layer 3 is etched by 5000 Å and the silicon layer 2 is partly etched by 1.5 $\mu$m.

When the etching process proceeds, the oxide film 4 of a thickness of 1000 Å which is formed inside the annular region formed of the oxide film 6 is etched to expose the silicon layer 3. At this time, the oxide film 6 left behind in an annular form around the oxide film 4 is etched only by 1000 Å. On the other hand, part of the silicon layer 2 is further etched by 1 μm.

When the etching process further proceeds and the silicon layer 3 of a thickness of 1.5 μm exposed inside the oxide film 6 which is left behind in the annular form is entirely etched, the oxide film 6 is etched by 1500 Å and part of the silicon layer 2 is etched by 1.5 μm.

Finally, as shown in FIG. 1D, the silicon layer 2 is formed into the column-shaped regions 2' and the silicon layer 3 is patterned into the annular form (annular regions 3') on the column-shaped regions 2' by using the oxide films 6 formed around the column-shaped regions 5' as an etching mask.

Figures 1E, 1F:
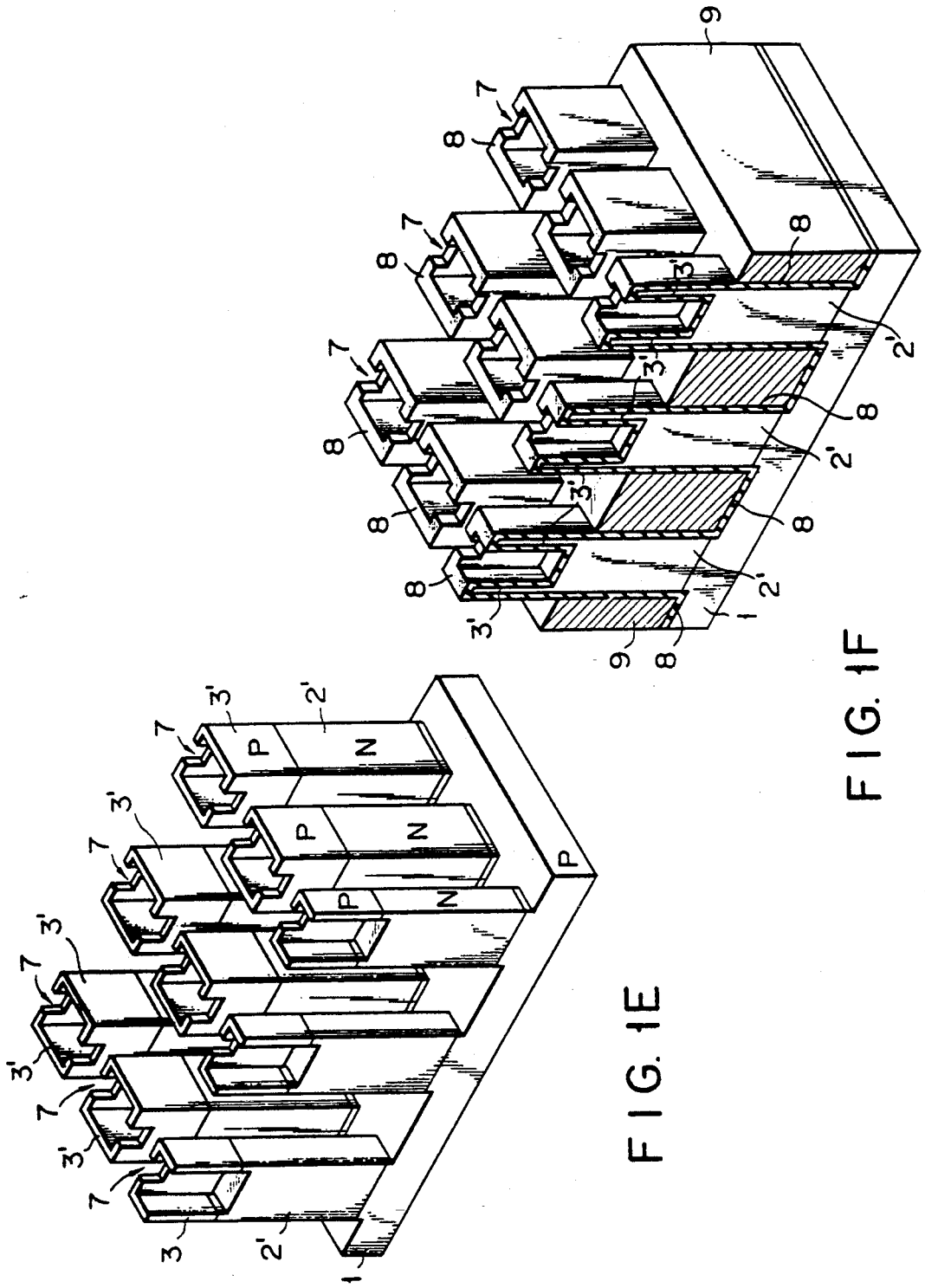

Next, as shown in FIG. 1E, the remaining oxide films 4 and 6 are etched out. Then, cut-away portions 7 extending in one direction along the array of the annular regions 3' are formed by use of the photoetching process using a photoresist. For example, the cut-away portion 7 is formed in a square form of 0.5 μm×0.5 μm. The cut-away portion 7 is used to connect polysilicon layers formed on the inner and outer walls of the annular region 3' in the later step.

Next, after the photoresist (not shown) is removed, dielectric layers 8 used as capacitor insulation films are formed on the exposed surfaces of the column-shaped regions 2' and annular regions 3'. For example, one method of forming the dielectric layers 8 may be effected by forming oxide films to a thickness of 100 Å on the above surfaces by the thermal oxidation process. Another method is attained by forming oxide films on the above surfaces by the thermal oxidation process and then forming nitride films on the surfaces thereof by a CVD method, for example, so as to form laminated layers of the silicon oxide films and silicon nitride films. With this structure, since the nitride film is used as a capacitor insulation film, an effect that the capacitance between the cell plate electrode and the storage node electrode can be made large can be attained. In the case of forming the laminated structure, it is also possible to form the nitride film and then form an oxide film on the surface thereof by pyrogenic oxidation, for example, to form a 3-layered laminated film of oxide film-nitride film-oxide film. Further, a laminated structure of more than three layers having nitride films and oxide films alternately disposed can be formed.

After the dielectric layers 8 are formed, a polysilicon layer 9 is formed on the resultant structure by a CVD method, for example. The polysilicon layer 9 is chemically etched by a CDE method which is an isotropic etching process to leave part of the polysilicon layer 9 only around the column-shaped regions 2'. The polysilicon layer 9 is used as a cell plate electrode. Since, at this time, the etching process is effected by the CDE method using the chemical reaction, the dielectric layer 8 is used as an etching mask, thus permitting only the polysilicon layer 9 to be etched.

Next, as shown in FIG. 1G, the exposed portions of the dielectric layers 8 are removed to expose the surfaces of the annular regions 3'. Then, the exposed surfaces of the annular regions 3' and the exposed surface of the polysilicon layer 9 are subjected to a thermal oxidation process to form a silicon oxide film 10. At this time, the oxidation condition including the oxidation temperature and oxidation time is adjusted so that the film thickness of the oxide film 10 may be set to approx. 500 Å on the exposed surface of the polysilicon layer 9 and approx. 200 Å on the exposed surface of the annular region 3'. The oxide film 10-1 with the film thickness of 200 Å is formed as a gate insulation film of a transfer gate transistor in the later step and the oxide film 10-2 with a film thickness of 500 Å is formed as an interlaid insulation film disposed between the transfer gate electrode and the cell plate electrode (Polysilicon layer 9). A polysilicon layer 11 is formed to a thickness of 1 μm on the resultant structure by the CVD method. The polysilicon layer 11 is formed to have an N-type conductivity type by diffusing phosphorus into the polysilicon layer 11 by use of phosphoryl chloride (POCl₃) or ion-implanting phosphorus into the polysilicon layer 11. The polysilicon layer 1 formed with the N-type conductivity type is etched by the RIE method and is left behind on the side walls of the annular regions 3' in an self-alignment manner. At this time, the polysilicon layers formed on the inner and outer walls of the annular region 3' are connected to each other via the cut-away portions 7 formed in the step shown in FIG. 1E. Since the interval between the adjacent column-shaped regions 5' is set to λ or 2λ as shown in FIG. 1B, the intervals of the column-shaped regions 3' are set to different values in the first direction and in the second direction which is substantially perpendicular to the first direction. As a result, those of the polysilicon layers 11 which are formed on the side walls arranged in the second direction in which the interval is set to 2λ are divided or separated from each other and those of the polysilicon layers 11 which are formed in the first direction in which the interval is set to λ are formed in a continuous configuration. Those of the polysilicon layers 11 which are continuously formed are used as a transfer gate electrode of each memory cell and at the same time constitute a word line.

Next, as shown in FIG. 1H, the polysilicon layer 11 is etched back by a thickness of approx. 2000 to 3000 Å by the CDE method. The etching-back process is effected to prevent occurrence of short-circuit between the word line and a bit line which is formed in the later step. Then, arsenic or phosphorus is ion-implanted into the annular regions 3' which are exposed by partly removing the polysilicon layer 11 so as to form N+-type drain diffused layers (or source diffused layers) 12.

Next, as shown in FIG. 1I, an insulation film 13 (silicon oxide film, for example) which is used as an interlaid insulation film is formed to a thickness of 1 μm on the resultant structure by the CVD method. Then, the insulation film 13 is etched back until the drain diffused layers 12 are exposed. The exposed portions are used as contact areas of the bit lines.

Next, as shown in FIG. 1J, a metal film used for forming bit lines is formed by a sputtering method and bit lines 14 are formed by patterning the metal film by use of the photoetching process. For example, an alloy of aluminum-silicon, an alloy of aluminum-silicon-copper, or tungsten may be used to form the metal film.

Thus, the memory cell portion is formed through the manufacturing steps described above. The memory cell portion has the following structure. That is, the first semiconductor region (column-shaped region) 2' of a first conductivity type (N-type) is formed in a column configuration on the P-type semiconductor substrate 1 and acts as a source region (or drain region) and a storage node electrode. The second semiconductor region (polysilicon layer) 9 of the first conductivity type is formed with the capacitor insulation film 8 disposed between it and the side wall of the first semiconductor region 2' and acts as a cell plate electrode. The third semiconductor region (annular region) 3' of a second conductivity type which is formed in an annular configuration is formed on the first semiconductor region 2' and acts as a channel region. The first conductive layer (polysilicon layer) 11 is formed with the gate insulation film (silicon oxide film) 10-1 disposed between it and each of the inner and outer side walls of the third semiconductor region 3' and acts as a transfer gate electrode. The fourth semiconductor region (drain diffused layer) 12 of the first conductivity type is formed in an area near the end portion of the opening of the third semiconductor region (annular region) 3' which is formed in the annular configuration and acts as a drain region (or source region). The second conductive layer (metal layer) 14 is formed in contact with the fourth semiconductor region 12 and acts as a bit line.

With the memory cell of the above construction, since the gate electrode (polysilicon layer 11) of the transfer gate MOS transistor is formed on the inner and outer side walls of the annular region (channel region) 3' to make a dual gate structure, the driving ability of the MOS transistor can be enhanced. As a result, reduction in the driving ability of the MOS transistor due to the presence of the interface state caused between the gate insulation film 10 and the annular region 3' formed by etching the silicon layer 3 can be suppressed. Further, it is known at the present stage of the study that the driving ability of the MOS transistor of the dual gate structure can be set to maximum by setting the thickness t of the annular region 3' to approx. 1000 Å. In the above embodiment, the thickness t is initially set to approx. 2000 Å, but it becomes approx. 1000 Å at the final stage after the steps of formation of the dielectric layer 8 and removal of the dielectric layer 8 shown in FIGS. 1F and 1G are effected. Therefore, the driving ability of the transfer gate MOS transistor can be made sufficiently large.

Secondly, since the bit line 14 is formed on the insulation film 13 (interlaid insulation film), the bit line 14 can be sufficiently separated from another conductive layer such as the polysilicon layer 9 (cell plate electrode), thereby reducing the parasitic capacitance. Since the parasitic capacitance associated with the bit line 14 can be considered only to be caused between the bit line and the drain diffused layer 12, the parasitic capacitance can be suppressed to minimum. As a result, the operation speed of the memory device can be enhanced.

Thirdly, since the word line (polysilicon layer 11) is formed on the side wall of the annular region 3' by use of the technique of leaving the polysilicon layer on the side wall in a self-alignment manner, it is not necessary to effect the mask alignment by the photo-etching process when the word line is formed. Therefore, it is advantageous for high integration. Further, with the technique of leaving the polysilicon layer on the side wall in the self-alignment manner, the polysilicon layer 11 can be divided in the second direction in which the interval between the annular regions 3' is large. An element isolation region can be formed only by burying the insulation film 13 into the divided portion and the trench formed around the annular region 3'. Also, in this respect, it is advantageous for high integration.

Fourthly, the contact area for the bit line 14 and the drain diffused layer 12 can be formed simply by etching back the insulation film 13 and it is not necessary to effect the mask alignment by the photoetching process. Also, in this respect, it is advantageous for high integration. Further, since the mask alignment process by the photoetching process can be omitted by the third and fourth reasons, the manufacturing cost can be reduced and the yield can be enhanced.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

I claim:

1. A method for manufacturing semiconductor memory devices comprising the steps of:

forming a first semiconductor layer of a first conductivity type on a substrate;

forming a second semiconductor layer of a second conductivity type on said first semiconductor layer;

forming a first insulation film on said second semiconductor layer;

forming a third semiconductor layer on said first insulation film;

patterning said third semiconductor layer into a column configuration;

subjecting a surface of said third semiconductor layer thus patterned to an oxidizing process to form a first oxide film;

selectively removing portions of said third semiconductor layer, first insulation film, second semiconductor layer, first semiconductor layer, and substrate by using said first oxide film as a mask to form said first semiconductor layer into a column configuration and form said second semiconductor layer into an annual configuration;

removing said first oxide film;

forming cut-away portions in a direction of an extension of word lines at portions of said second semiconductor layer which is formed in the annular configuration;

forming a second insulation film around said first semiconductor layer which is formed in the column configuration;

forming a fourth semiconductor layer on a first resultant structure;

etching back said fourth semiconductor layer until said second semiconductor layer is entirely exposed and leaving said fourth semiconductor layer around said second insulation film;

forming a third insulation film around said second semiconductor layer which is exposed and said fourth semiconductor layer which is exposed;

forming a first conductive layer acting as a word line on a second resultant structure;

leaving said first conductive layer on a side wall of said third insulation film;

etching back a remaining portion of said first conductive layer to expose a part of said second semiconductor layer;

forming an impurity region of the first conductivity type in an area near the exposed portion of said second semiconductor layer;

forming a fourth insulation film on a third resultant structure;

etching back said fourth insulation film at least until said impurity region of the first conductivity type is exposed; and forming a second conductive layer acting as a bit line in contact with said impurity region of the first conductivity type.

2. A method according to claim 1, wherein said substrate includes a semiconductor substrate of the second conductivity type.

3. A method according to claim 1, wherein said first semiconductor layer is formed on said substrate by an epitaxial growth method.

4. A method according to claim 1, wherein said second semiconductor layer is formed on said first semiconductor layer by an epitaxial growth method.

5. A method according to claim 1, wherein said first insulation film is formed by subjecting a surface of said second semiconductor layer to an oxidation process.

6. A method according to claim 1, wherein said third semiconductor layer is formed of a polysilicon layer.

7. A method according to claim 1, wherein said step of patterning said third semiconductor layer into the column configuration is effected by an anisotropic etching.

8. A method according to claim 1, wherein said step of forming said first semiconductor layer into the column configuration and forming said second semiconductor layer into the annular configuration is effected by an anisotropic etching.

9. A method according to claim 1, wherein said fourth semiconductor layer is formed of polysilicon.

* * * * *